CURRENT CONTROLLED NEGATIVE RESISTANCE SEMICONDUCTOR DEVICE

Filed Nov. 10, 1959

WITNESSES

Edwin E. Bassler

Charles L. Menzimer

INVENTORS
Herbert W. Henkels
& Gene Strull
BY
Frederick Shapoe
ATTORNEY

United States Patent Office 3,054,912
Patented Sept. 18, 1962

3,054,912
CURRENT CONTROLLED NEGATIVE RESISTANCE SEMICONDUCTOR DEVICE

Gene Strull, Pikesville, Md., and Herbert W. Henkels, Rockwood, Pa., assignors to Westinghouse Electric Corporation, East Pittsburgh, Pa., a corporation of Pennsylvania Filed Nov. 10, 1959, Ser. No. 852,038
5 Claims. (Cl. 307—88.5)

This invention relates generally to a semiconductor device, and more specifically to a three terminal, current controlled, negative resistance semiconductor device.

An object of the present invention is to provide a three terminal, current controlled, negative resistance semiconductor device.

Another object of the present invention is to provide a three terminal, current controlled, negative resistance semiconductor device suitable for use as a current controlled switch.

Another object of the present invention is to provide a three terminal, current controlled, negative resistance semiconductor device suitable for use as a normally-closed relay.

Another object of the present invention is to provide a three terminal, current controlled, negative resistance semiconductor device in which the flow of an input current passing through four semiconductor regions is controlled by current being applied through a highly doped region in the device.

Other objects of the present invention will, in part, appear hereinafter and will, in part, be obvious.

For a better understanding of the nature and objects of the invention, reference should be had to the following detailed description and drawings, in which:

FIGURE 1 is a side view, in cross-section, of a wafer of semiconductor material;

FIGS. 2 through 5 inclusive are side views, in cross-section, of the wafer of FIG. 1 undergoing successive processing steps in accordance with the teachings of this invention;

In accordance with the present invention and attainment of the foregoing objects, there is provided a current controlled, negative resistance semiconductor device comprising, a region of a high resistivity semiconductor material having a first type of semiconductivity, a first layer of a highly doped semiconductor material having the first type of semiconductivity disposed upon and having one surface coextensive and contiguous with one surface of said region, a second layer of semi-conductor material having a second type of semiconductivity disposed upon a portion of the other surface of said first layer, an extremely abrupt p-n junction being formed between said first layer and said second layer, an electrical contact disposed upon the portions of said other surface of said first layer not covered by the second layer, said electrical contact being isolated from said second layer, a third layer of a semiconductor material having the second type of semiconductivity disposed upon a portion of the other surface of the region of high resistivity and forming a p-n junction therebetween, and electrical contacts to said third layer and to the second layer.

The semiconductor device of this invention is a three terminal device, however, its mode of operation is closely related to that of the tunnel diode. In both devices the electrons travel across the barrier or junction with the speed of light, or produce the same effect, even though they do not seem to have the energy to surmount the barrier. This is known as the quantum tunnel effect.

For the purpose of clarity, the present invention will be described specifically in terms of an n—p(+)—p—n silicon device. It will, however, be understood that the invention is applicable in a similar manner to produce p—n(+)—n—p devices. The semiconductor material employed may be silicon, germanium, silicon carbide or a stoichiometric compound comprised of elements from group III of the periodic table, for example, gallium, aluminum and indium, and elements of group V, for example, arsenic, phosphorus and antimony. Examples of suitable III—V stoichiometric compounds are gallium arsenide and indium antimonide.

Figure 1:
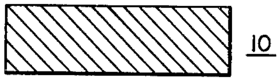

With reference to FIG. 1, there is illustrated a silicon wafer 10 of p-type semiconductivity. The wafer may comprise the usual amount of doping for transistor uses, for example, from 1 to 10,000 ohm-cm. resistivity. The wafer 10 may be prepared by any of the methods known to those skilled in the art. For example, a silicon rod may be pulled from a melt comprised of silicon and at least one element from group III of the periodic table, for example, boron, aluminum, gallium or indium. The wafer 10 is then cut from the rod with, for example, a diamond saw. The surface of the wafer may then be lapped or etched or both to produce a smooth surface after sawing.

The wafer 10 is then disposed in a diffusion furnace. The hottest zone of the furnace is at a temperature within the range of from about 1100° C. to 1250° C. and has an atmosphere of the vapor of an acceptor doping material, for example, boron, aluminum, gallium or indium. The zone of the furnace within which a crucible of said acceptor impurity lies may be at a temperature of from about 600° C. to 1250° C., the specific temperature being chosen to ensure a desired vapor pressure and surface concentration of diffusant from the crucible. The acceptor impurity diffuses into the surface of the p-type wafer. Since the acceptor impurity will normally diffuse through all sides of the wafer it may be necessary to mask the sides or other surfaces with, for example, an oxide layer or the like, through which no diffustion is desired. On the other hand, diffusion may be effected through all surfaces of the wafer, and the undesired diffused layers removed afterwards by lapping or etching or a combination of lapping and etching.

Figure 2:
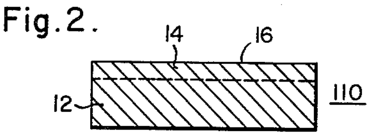

With reference to FIG. 2, there is illustrated a wafer 110 which is the p-type wafer of FIG. 1 after diffusion, in which doping impurities were diffused only into the top surface 16 of the wafer. The wafer 110 is comprised of a bottom region 12 of p-type semiconductivity and a top layer 14 of p(+) semiconductivity. The region 14 has a doping carrier concentration of greater than $10^{19}$ but not in excess of about $10^{24}$ acceptor atoms per cubic centimeter of silicon. The thickness of layer 14 may vary considerably.

Figure 3:
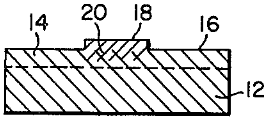

As shown in FIG. 3, a layer 18 of n-type semiconductivity is then formed by disposing a donor doping material or alloy in the form of a foil or pellet, preferably having a thickness of about from 0.75 mil to 2.0 mils, upon surface 16 of the p(+) layer 14 and fusing the foil or pellet to the p(+)-type region by heating in a vacuum or inert atmosphere, for example an argon or helium atmosphere at a temperature of from 650° C. to 750° C. Care must be taken that the layer 18 does not penetrate through layer 14 to region 12, but forms a p-n junction 20 therewith. It is critically important that the p-n junction so formed be a sharp, abrupt and non-graded junction. The selection of the doping impurity and the processing should be carefully carried out to attain this abrupt junction. It has been found that if the p-n junction is a graded junction, the final device will not have the desired I—V characteristics.

Examples of suitable doping materials or alloys of which the layer 18 may be comprised include arsenic phosphorus, or antimony, and alloys thereof, examples being alloys of gold and antimony phosphorus, or arsenic. For instance, a foil of an alloy comprising 99.5%, by weight, gold and 0.5%, by weight, arsenic, is suitable.

Figure 4:
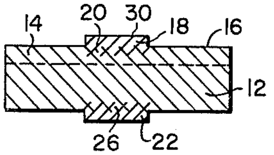

With reference to FIG. 4, a layer 22 of an alloy having n-type or donor doping characteristics is then bonded by fusion to bottom surface 24 of the p-type region 12. The donor alloy of layer 22 which may be in the form of a foil, pellet or the like is comprised of at least one element from group V of the periodic table, for example, antimony, arsenic and phosphorus. The alloy 22 may also be comprised of a group V element and a relatively non-doping carrier metal, for example, gold. Such an alloy found particularly suitable for use in the practice of this invention is a gold-antimony alloy comprised of 99.5%, by weight, gold and 0.5%, by weight, antimony.

Figure 5:
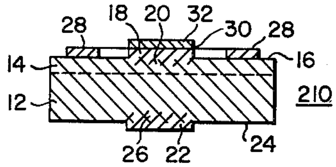

Thereafter, as illustrated in FIG. 5, a metallic ohmic contact 28 comprised of, for example, an aluminum antimony alloy is disposed upon and fused to surface 16 of p(+) layer 14. The composition of the contact 28 is not considered to be critical and may be of any suitable ohmic material either neutral or p-type. The ohmic contact 28 is physically isolated from the layer 18. The ohmic contact 28 is illustrated in FIG. 5 to be of annular configuration, however, the ohmic contact 28 may be of rectangular or any other suitable configuration.

An ohmic contact 32 is joined to surface 30 of layer 18. The ohmic contact 32 may be comprised of any suitable ohmic material. A particularly suitable ohmic contact has been found to be one comprised of gold or a gold-antimony alloy. Electrical leads can be applied to contacts 22, 32 and 28 in a conventional manner.

The complete device 210, as illustrated in FIG. 5, is a current controlled, negative resistant semiconductor device suitable for use among other things as a current control switch, and a normally-closed relay. The operation of the device 210 of FIG. 5 may be controlled in various ways, including application of a separate electrical circuit, as will be described in greater detail hereinafter.

Figure 6:
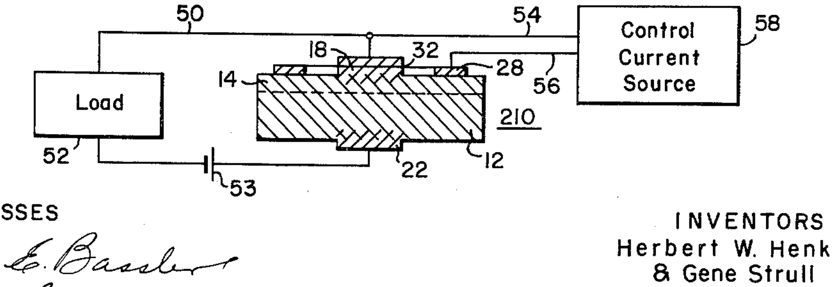
FIG. 6 is a schematic circuit diagram showing the employment of the semiconductor device of this invention.

With reference to FIG. 6, there is illustrated the semiconductor device 210 connected in a circuit so as to function as a current controlled switch. The device 210 is connected to a load 52 by a conductor 50 and is in circuit with a source of current 53. Conductor 50 completes its circuit to the device 210 through the ohmic contact 32 on layer 18 and layer 22. The device 210 is connected to a control current source 58 by conductors 54 and 56. Conductor 54 is connected to the ohmic contact 32 of layer 18. Conductor 56 from the current control source 58, is connected to the ohmic contact 28 disposed upon surface 16 of p(+) region 14.

Figure 7:
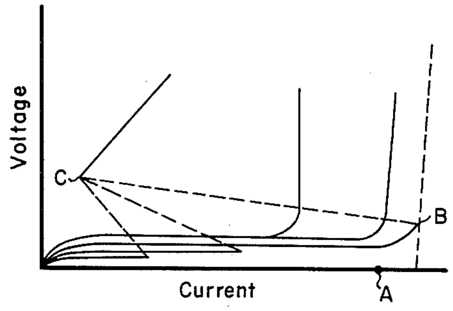
FIG. 7 is an I—V diagram showing the operating characteristics of the semiconductor device of this invention when functioning as a current control switch; and, FIG. 8 is an I—V diagram showing the operating characteristics of the semiconductor device of this invention while operating as a normally-closed relay.

The device 210, illustrated in FIG. 5, may be used in either of two ways. With reference to FIG. 7, the device 210 can be biased from power source 53 with a critical control bias and operated as a current control switch or fuse. In this mode of operation, the device would be operated in the current range between points O to A passing current to a load with a very low voltage drop. Selected current is introduced from the device 58. If the total current exceeded current B due to some change in the state of operation of the device, for example a fault, the semiconductor device will instantly switch to point C where only small currents would flow, thereby preventing substantial power from flowing through the load.

Figure 8:
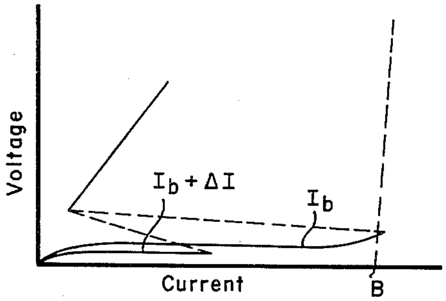

A second mode of operation of the device 210 is illustrated in FIG. 8. In this mode of operation the device is operated with a certain bias on power source 53 that places current passing therethrough in the region O to B. If the bias is increased by the amount $\Delta I$ from control current source 58, the load circuit would be affected by an abrupt change in the impedance of the semiconductor device thereby drastically reducing the amount of current or power flowing to the load to a very small value. Thus, the control device is capable of turning the circuit off. In this last mode of operation, the device 210 has characteristics similar to a normally-closed relay.

In addition to being a current control device with many applications, the semiconductor device of this invention has the further advantage of being controllable by means of a separate circuit. Thus, by means of a control electrode, a load may be turned off without employing elements which have moving parts as is currently the practice.

The following example is illustrative of the practice of this invention.

*Example*

A flat circular wafer of p-type silicon having a resistivity of 200 ohm-cm., and of a diameter of .8 inch and a thickness of 3 mils, was disposed in a diffusion furnace. The diffusion furnace was at a maximum temperature of 1200° C. and had a gallium vapor atmosphere. The gallium was allowed to diffuse into the wafer to a depth of 1 mil. The wafer was then removed from the diffusion furnace, and the area in which gallium had diffused was abraded from all surfaces except the top surface of the wafer. The top surface area with gallium diffused therein had a p(+) semiconductivity and an acceptor concentration greater than $10^{19}$ carriers per cubic centimeter of silicon.

The wafer was charged into a second diffusion furnace. The diffusion furnace was at a maximum temperature of 1250° C. and had a phosphorus vapor atmosphere. The phosphorus was allowed to diffuse only into a central portion of the p(+) region to a depth within about 0.1 mil of the p region. The water was then removed from the diffusion furnace.

A gold antimony pellet comprised of 99.5%, by weight, gold and .5%, by weight, antimony, and having a thickness of approximately 0.001 inch was disposed upon the bottom surface of the original p region and fused thereto at a temperature of approximately 750° C. After alloying the gold antimony pellet to the wafer, the structure was essentially that illustrated in FIG. 4.

A gold antimony alloy contact was fused to the upper surface of the phosphorus diffused n-type central portion, and an annular ohmic contact comprised of an aluminum-antimony alloy was fused to the p(+) region in such a manner as to be physically isolated from the n-type phosphorus region. The structure is that shown in FIG. 5.

The I—V characteristics of the device thus prepared were determined and are essentially those shown in FIGS. 7 and 8.

While the invention has been described with reference to particular embodiments and examples, it will be understood that modifications, substitutions and the like may be made therein without departing from its scope.

We claim as our invention:

1. A current controlled negative resistance semiconductor device comprising, a region of a semiconductor material having a first type of semiconductivity, a thin layer of a more highly doped semiconductor material having the first type of semiconductivity and being of considerably lower resistivity than the region, said first layer being disposed upon and having one surface thereon coextensive and contiguous with one surface of said region, a second layer of a semiconductor material having a second type of semiconductivity disposed upon another surface of said first layer, a highly abrupt p-n junction being formed between said first layer and said second layer, an electrical contact disposed upon said another surface of said first layer and being isolated from said second layer, a third layer of a semiconductor material having the second type of semiconductivity disposed upon a portion of another surface of the region and separated from the first layer and providing a p-n junction therebetween.

2. A current controlled negative resistance semiconductor device comprising, a region of a semiconductor material having a first type of semiconductivity, a thin first layer of a more highly doped semiconductor material having the first type of semiconductivity, said first layer being disposed upon and having one surface thereof coextensive and contiguous with one surface of said region, a second layer of a semiconductor material having a second type of semiconductivity disposed upon the other surface of said first layer, a p-n junction between said first layer and said second layer, an electrical contact disposed upon said other surface of said first layer, said electrical contact being physically isolated from said second layer, and electrical contacts disposed upon the other surface of said second layer, a third region of a semiconductor material having the second type of semiconductivity disposed upon a portion of the other surface of the region, and a p-n junction therebetween.

3. A current controlled negative resistance semiconductor device comprising, a region of a semiconductor material having a first type of semiconductivity and having a resistivity of the order 1 to 2000 ohm cm., a thin first layer of a semiconductor material having the first type of semiconductivity, said first layer having a carrier concentration of at least $10^{19}$ carriers per cubic centimeter of material, said first layer being disposed upon and having one surface thereof contiguous and coextensive with one surface of said region, a second layer of a semiconductor material having a second type of semiconductivity disposed upon the other surface of said first layer, a p-n junction between said first layer and said second layer, an electrical contact disposed upon said other surface of said first layer, said electrical contact being physically isolated from said second layer, a third region of a semiconductor material having the second type of semiconductivity disposed upon a portion of the other surface of the region of high resistivity, and a p-n junction therebetween.

4. In a circuit, a current controlled negative resistance semiconductor device comprising, a region of a semiconductor material having a first type of semiconductivity, a thin layer of a more highly doped semiconductor material having the first type of semiconductivity and being of considerably lower resistivity than the region, said first layer being disposed upon and having one surface thereon coextensive and contiguous with one surface of said region, a second layer of a semiconductor material having a second type of semiconductivity disposed upon another surface of said first layer, a highly abrupt p-n junction being formed between said first layer and said second layer, an electrical contact disposed upon said another surface of said first layer and being isolated from said second layer, a third layer of a semiconductor material having the second type of semiconductivity disposed upon a portion of another surface of the region and separated from the first layer and providing a p-n junction therebetween, a first source of current biased across said third layer and said second layer to cause an electrical current to pass therethrough to a load, a source of a control current biased across the electrical contact and said second layer to enable a current to be passed therethrough, whereby, current from the first source may be subjected to controlled flow by reason of the semiconductor device assuming a relatively low resistance mode or a high resistance mode which functions to greatly reduce the flow of current to the load.

5. In a circuit, a current controlled negative resistance semiconductor device comprising, a region of a semiconductor material having a first type of semiconductivity and having a resistivity of the order 1 to 2000 ohm cm., a thin first layer of a semiconductor material having the first type of semiconductivity, said first layer having a carrier concentration of at least $10^{19}$ carriers per cubic centimeter of material, said first layer being disposed upon and having one surface thereof contiguous and coextensive with one surface of said region, a second layer of a semiconductor material having a second type of semiconductivity disposed upon the other surface of said first layer, a p-n junction between said first layer and said second layer, an electrical contact disposed upon said other surface of said first layer, said electrical contact being physically isolated from said second layer, a third region of a semiconductor material having the second type of semiconductivity disposed upon a portion of the other surface of the region, and a p-n junction therebetween, a first source of current biased across said third layer and said second layer to cause an electrical current to pass therethrough to a load, a source of a control current biased across the electrical contact and said second layer to enable a current to be passed therethrough, whereby, current from the first source may be subjected to controlled flow by reason of the semiconductor device assuming a relatively low resistance mode or a high resistance mode which functions to greatly reduce the flow of current to the load.

References Cited in the file of this patent

UNITED STATES PATENTS

| | | |
|---|---|---|
| 2,740,076 | Matthews et al. | Mar. 27, 1956 |
| 2,861,229 | Pankove | Nov. 18, 1958 |
| 2,895,109 | Weinreich | July 14, 1959 |